United States Patent [19]
Amemiya et al.

[11] 4,125,023
[45] Nov. 14, 1978

[54] TEMPERATURE-MEASURING APPARATUS

[75] Inventors: Hiroshi Amemiya, Fujisawa; Yukito Abe, Yokohama, both of Japan

[73] Assignee: Tokyo Shibaura Electric Co., Ltd., Kawasaki, Japan

[21] Appl. No.: 751,679

[22] Filed: Dec. 17, 1976

[30] Foreign Application Priority Data

Dec. 20, 1975 [JP] Japan .................................. 50-152491

[51] Int. Cl.² ............................................. G01K 7/16
[52] U.S. Cl. ............................................ 73/362 AR
[58] Field of Search ............... 73/362 AR; 323/75 N

[56] References Cited
U.S. PATENT DOCUMENTS

| 2,938,385 | 5/1960 | Mack et al. | 323/75 N X |
| 3,060,379 | 10/1962 | Osvold | 323/75 N X |
| 3,875,503 | 4/1975 | Hayashi | 73/362 AR |
| 3,913,096 | 10/1975 | Veszi | 73/362 AR X |
| 3,915,003 | 10/1975 | Adams | 73/362 AR |
| 4,007,832 | 2/1977 | Paull et al. | 73/362 AR X |

Primary Examiner—Jerry W. Myracle
Attorney, Agent, or Firm—Oblon, Fisher, Spivak, McClelland & Maier

[57] ABSTRACT

A temperature-measuring apparatus which comprises a first series circuit formed of first and second resistor elements connected between first and second power supply terminals; a second series circuit including a third resistor element connected to the first power supply terminal, a thermosensitive resistor which is connected to the second power supply terminal and whose resistance varies with temperature, a standard resistor having an equal resistance to that which the thermosensitive resistor indicates at a referential temperature, and a switching element for connecting the third resistor element selectively to the thermo-sensitive resistor or standard resistor; and analog-digital converter which is impressed with voltage occurring between the junction of the first and second resistor elements and the junction of the third resistor and thermo-sensitive resistor or standard resistor and makes counts corresponding to the measured resistance of the thermo-sensitive resistor and that of the standard resistor; first and second registers for storing counts delivered from the analog-digital converter which corresponds to the measured resistance of the thermo-sensitive resistor and that of the standard resistor; a third register for storing a count corresponding to the referential temperature; a subtractor for subtracting the contents of the second register from those of the first register; and an adder for adding together an output count from the subtractor and a count denoting the contents of the third register.

16 Claims, 8 Drawing Figures

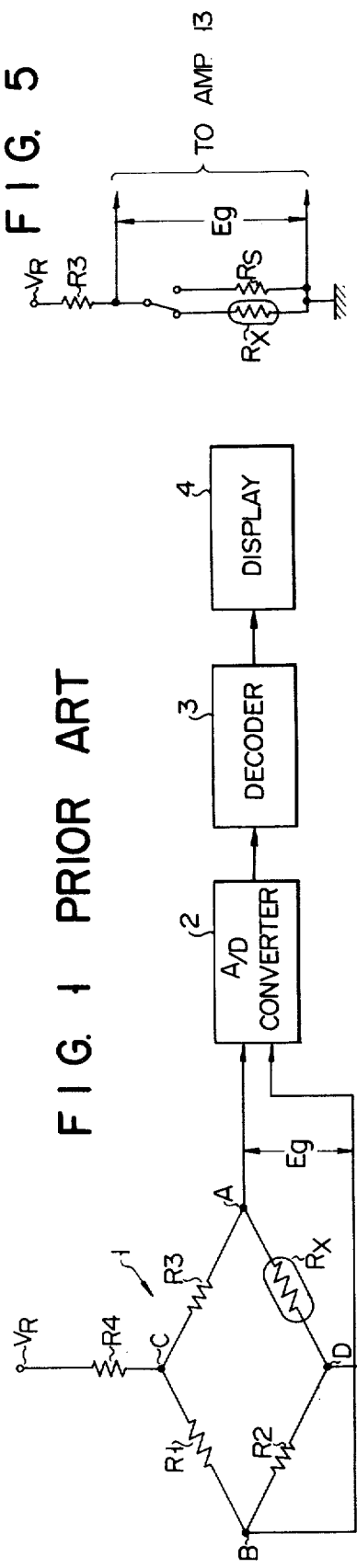
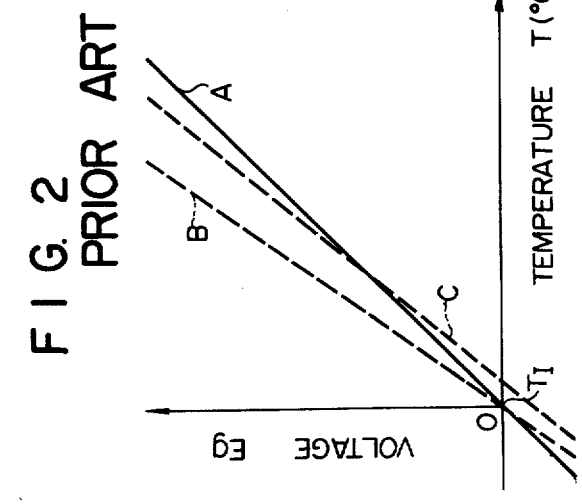
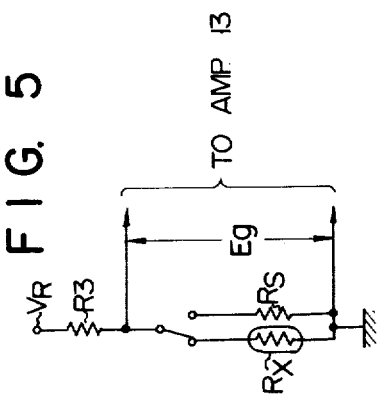
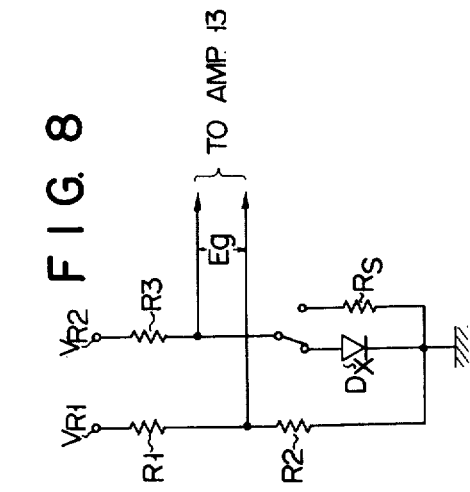
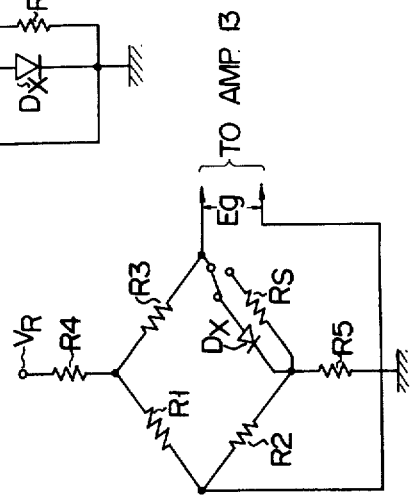
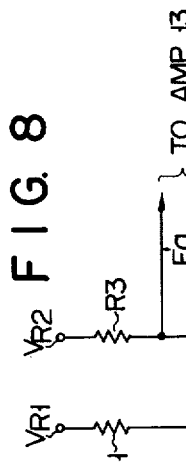

TEMPERATURE-MEASURING APPARATUS

BACKGROUND OF THE INVENTION

This invention relates to a temperature-measuring apparatus for determining temperature with the aid of a thermo-sensitive element.

Hitherto, electronic measurement of, for example, body temperature has been undertaken by a clinical thermometer having such an arrangement as is shown in FIG. 1. The clinical thermometer is provided with a bridge circuit 1 formed of a thermistor Rx acting as a thermo-sensitive resistor element, and resistors R1, R2 and R3. Resistors R4 and R5 are used as d.c. bias resistors. The resistances of all these resistors are so preset as the cause voltage Eg across the output terminals A and B of the bridge circuit 1 to indicate 0 at a initial temperature $T_I$, for example, 32° C. When the resistance of the thermistor Rx varies with body temperature, then an unbalanced voltage Eg appearing between the output terminals A and B of the bridge circuit 1 is impressed on an analog-digital converter 2, which converts said voltage into a digital signal, for example, a binary decimal code. An output signal from said A/D converter 2 is conducted to a display device 4 through a decoder 3, to indicate the measured body temperature in the form of digits.

Where, with the prior art temperature measuring apparatus, a referential voltage impressed between the power supply terminals of the bridge circuit 1 is denoted by $V_R$, then an output voltage Eg from said bridge circuit 1 may be expressed by the following equation (assuming R4 = R5 = 0):

$$Eg = \frac{R2 \cdot R3 - Rx \cdot R1}{(R1 + R2)(R3 + Rx)} \cdot V_R \tag{1}$$

Since the body temperature T and the resistance of the thermistor Rx are in inverse proportion, an output voltage Eg from the bridge circuit 1 have a relationship shown in a solid line A in FIG. 2. Where the referential voltage $V_R$ changes, for example, increases, then the output voltage Eg and body temperature present a relationship indicated in a broken line B in FIG. 2 which passes through a point representing the initial body temperature $T_I$ at a different gradient from the solid line A with Eg taken to be 0.

Where not only the referential voltage $V_R$ but also the resistances of the resistors R1, R2 and R3 change, then the output voltage Eg and Body temperature indicate a relationship illustrated by another broken line C which does not pass through the point of the initial temperature $T_I$ but shows a different gradient from the above-mentioned lines A, B. Thus, the body temperature can not be correctly measured by variations in the referential voltage $V_R$ and the resistances of the resistors R1, R2, R3.

The A/D converter 2 is generally of a dual slope type. The offset voltage of an operation amlifier used with said dual slope type A/D converter causes variation in the initial temperature $T_I$, leading to errors of measurement.

SUMMARY OF THE INVENTION

It is accordingly the object of this invention to provide a temperature-measuring apparatus which digitally processes temperature data supplied from a resistor circuit comprising at least one passive circuit element, thermo-sensitive resistor element and standard resistor element and correctly measures temperature without being affected by changes in the referential voltage supplied to the resistor circuit, in the resistance of the aforesaid at least one passive circuit element and also in offset voltage of an operation amplifier used.

According to an aspect of this invention, there is provided a temperature-measuring apparatus which comprises a series circuit including a switching element taking first and second operative positions, a thermo-sensitive resistor, one end of which is connected to said switching element when taking the first operative position, and whose resistance varies with temperature, and a passive circuit element; a standard resistor, one end of which is connected to the other end of the thermo-sensitive resistor, the other end of which is connected to the switching element when it takes the second operative position, and whose resistance is independent of temperature and is equal to that which the thermo-sensitive resistor indicates at the referential temperature, switch actuating means for selectively setting the switching element to the first or second operative position; means for generating digital data corresponding to the measured resistances of the thermo-sensitive resistor and standard resistor; and an operation circuit for producing temperature data corresponding to the measured resistance of the thermo-sensitive resistor by processing digital data on temperature supplied from said digitial datagenerating means.

The temperature-measuring apparatus thus constructed is little affected by variations in the initial temperature and in the inclination of a straight line showing the relationship between the voltage and temperature T.

BRIEF DESCRIPTION OF THE DRAWING

FIG. 1 is a circuit diagram of the prior art body temperature-measuring apparatus;

FIG. 2 illustrates the relationship of body temperature and voltage impressed between the prescribed terminals of a bridge circuit used with the prior art body temperature measuring apparatus of FIG. 1.

FIGS. 5 to 8 each show a modification of part of the body temperature measuring circuit shown in FIG. 3 or 4.

DESCRIPTION OF THE PREFERRED EMBODIMENTS

Figure 3:
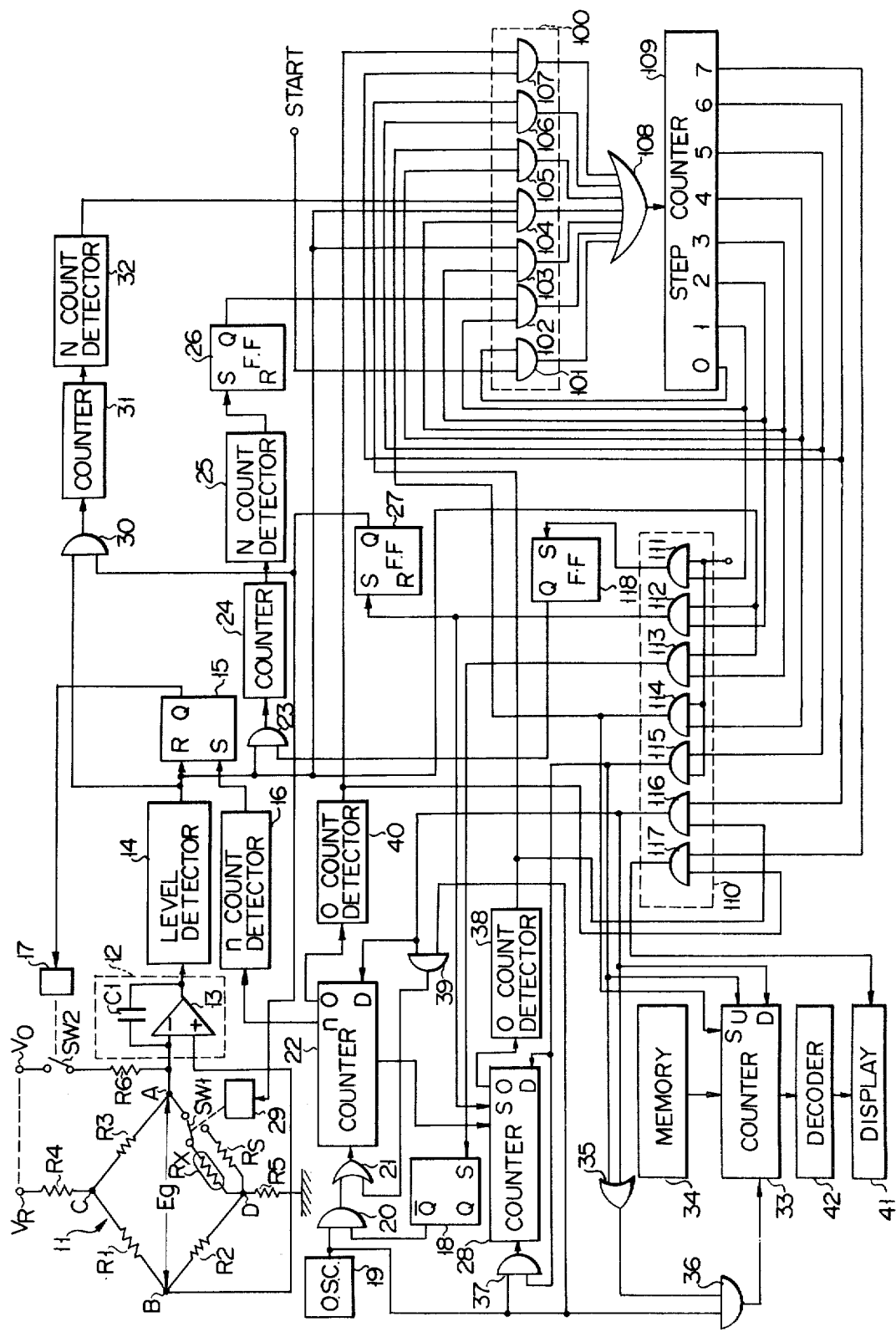
FIG. 3 is a circuit diagram of a body temperature-measuring apparatus according to an embodiment of this invention.

A body temperature-measuring apparatus of FIG. 3 embodying this invention is provided with the same type of bridge circuit 11 including resistors R1, R2 and R3 as that of the prior art body temperature-measuring apparatus of FIG. 1. The bridge circit 11 of this invention comprises a thermo-sensitive resistor Rx such as a thermistor and standard resistor Rs which are disposed between the terminals A and D and are connected at one end to the terminal D, and a switch SW1 for selectively connecting the other end of the thermo-sensitive resistor Rx or standard resistor Rs to the terminal A. The standard resistor Rs has a resistance substantially equal to that which the thermo-sensitive resistor Rx indicates at a standard temperature $T_O$, for example of 37° C. The resistors R1, R2, and R3 are chosen to have such resistances as to cause an unbalanced voltage to be developed between the terminals A and B when the switch SW1 is thrown toward the thermo-sensitive resistor Rx or standard resistor Rs. At the start of operation, the switch SW1 is thrown, as shown in FIG. 3, toward the thermo-sensitive resistor. An unbalanced voltage Eg delivered from between the output terminals A and B of the bridge circuit 11 is supplied to the input terminal of an integration circuit formed of an operational amplifier 13 and capacitor C1. This integration circuit 12 supplies a level detector 14 with, for example, an increasing voltage at a gradient corresponding to an input voltage. The level detector 14 generates a signal when an input voltage reaches a prescribed level. When set by an n-count detector 16 as later described, a flip-flop circuit 15 whose reset terminal R receives an output signal from the level detector 14 closes a switch SW2 with an actuator 17 energized by an output signal from the output terminal Q of said flip-flop circuit 15. When the switch SW2 is closed, a voltage $V_O$ is impressed on the terminal A of the bridge circuit 11 through a resistor R6. As the result, a voltage impressed between the terminals A and B of the bridge circuit 11 has its polarity reversed, causing the integration circuit 12 to generate a voltage which progressively decreases at a prescribed gradient. The voltage terminals for voltage $V_R$ and $V_O$ can be connected to each other as indicated by broken lines in FIG. 3.

Since a flip-flop circuit 18 remains reset at the start of operation, a pulse oscillator 19 supplies clock pulses to a counter 22 through an AND gate 20 opened by an output signal from the flip-flop circuit 18 and an OR gate 21. This counter 22 is formed of a ring counter having a capacity of n counts. An n count generated from the counter 22 energizes the n count detector 16, which in turn produces a signal to set the flip-flop circuit 15. As the result, the switch SW2 is closed, causing the magnitude of an output signal from the integration circuit 12 to begin to decrease at a prescribed gradient. When the integration circuit 12 sends forth an output voltage having a prescribed level, then the level detector 14 generates an output signal to reset the flip-flop circuit 15. Accordingly, the switch SW2 is opened, and an output signal from the integration circuit 12 increases in magnitude. An output signal from the integration circuit 12 which is of the dual slope type begins to decrease in magnitude when the contents of the counter 22 indicates zero. After falling to a prescribed level, the magnitude of said output signal rises again, until the counter generates an n count. Immediately afterward, the contents of the counter 22 are returned to zero. Later the same process of operation is repeated. Thus, a sum of the time required to integrate signal levels and the time required to integrate the levels of the referential voltage is made constant.

A condition detector 100 comprises AND gates 101 to 107, output signals from which are delivered to a step counter 109 through an OR gate 108. With this step counter 109, a count is increased by one, each time an output signal from the OR gate 108 is supplied to the counter 109. Thus, the step counter 109 produces an output signal corresponding to its contents through any of the output terminals "O" "7." An operation control circuit 110 comprises AND gates 111 to 117, and issues a control signal according to an output signal from the step counter 109.

Where the step counter 109 has contents of zero, and the AND gate 101 of the condition detector 100 is supplied with a start signal, then the AND gate 101 is opened by an output signal from the step counter 109 which has been issued from the output terminal "O," and supplies an output signal to the step counter 109 through the OR gate 108, thereby changing the contents of the step counter 109 to "1." An output signal from the output terminal "1" of the step counter 109 is conducted to the AND gate 111 of the operation control circuit 110. Since the other input terminal of the AND gate 111 is supplied with a high level signal when the temperature measuring apparatus is operated, an output signal from the output terminal "1" of the step counter 109 is carried to the set terminal of the flip-flop circuit 118 through the AND gate 111, thereby setting the flip-flop circuit 118. An output signal from the Q terminal of the flip-flop circuit 118 is supplied to the AND gate 23, through which an output signal from the level detector 14 is delivered to the counter 24. When detecting that the counter 24 has made an N count, an N count detector 25 sends forth an output signal to the set terminal of a flip-flop circuit 26 for setting.

An output signal from the Q terminal of the flip-flop circuit 26 thus set is supplied to the step counter 109 through the AND gate 102 opened by an output signal from the output terminal "1" of the step counter 109 and OR gate 108, causing the contents of the step counter 109 to be changed to "2." An output singal of the count 2 from the step counter 109 is supplied to the AND gate 112 of the control circuit 110, to open the AND gate 112. The other input terminal of the AND gate 112 is connected to the output terminal of the level detector 14. An output signal which the level detector 14 generates when the step counter 109 has a count of "2" is conducted to the set terminal of a flip-flop circuit 27 through the AND gate 112 to set the flip-flop circuit 27, and also a presettable up-down counter 28. Thus the current count of the counter 22 is preset in the presettable up-down counter 28. As the result, this presettable up-down counter 28 holds a count denoting digital data corresponding to the resistance of the thermo-sensitive resistor Rx affected by temperature change.

An output signal from the O terminal of the flip-flop circuit 27 which has been set energizes an acutator 29 to throw the switch SW1 toward the resistor Rs and is also supplied to an AND gate 30, causing an output signal from the level detector 14 to be carried to a counter 31 through the AND gate 30. At this time, the output signal from the level detector 14 is supplied to the step counter 109 through the AND gate 103 opened or enabled by an output signal from the output terminal "2" of the counter 109 and the OR gate 108, thereby causing the counter 109 to have a content of "3."When detecting an N count made by the counter 31, an N count detector 32 sends forth an output signal to the AND gate 104 of the condition detector 100. The AND gate 104 is opened by an output signal from the output terminal "3" of the step counter 109 and an output signal from the N count detector 32. At this time, an output signal from the level detector 14 is conducted to the step counter 109 through the AND gate 104 now opened and the OR gate 108 to advance the contents of the step counter 109 to a count of "4". Thus, analog data corresponding to the resistances of the resistors Rx and Rs is converted into digital data.

An output signal of the count "3" from the step counter 109 is delivered to the 2-input AND gate 113 of the control circuit 110, an output from the level detector 14 is supplied to the set terminal S of the flip-flop circuit 18 through the AND gate 113 to set the flip-flop circuit 18. An output signal from the $\overline{Q}$ terminal of the flip-flop circuit 18 which has thus been set is carried to the AND gate 20 to close the same, preventing an output clock pulse of the oscillator 19 from being supplied to the counter 22 through the AND gate 20. As the result, the counter 22 holds a count denoting a digital data corresponding to the resistance of the standard resistor Rs. An output signal of the count "4" from the step counter 109 is supplied as a set signal to a presettable up-down counter 33 through the AND gate 114, one of whose input terminals receives a high level signal when the subject temperature-measuring apparatus is in operation, causing the contents of a memory 34 storing a count denoting a digitial data corresponding to, for example, a referential body temperature to be preset in the up-down counter 33. An output signal from the AND gate 114 is carried to the step counter 109 through the AND gate 105 which is now opened or enabled by an output signal of the count "4" from the step counter 109 and OR to advance the contents of the step counter 109 to a count "5". An output signal of the count "5" from the step counter 109 is supplied to the up-count terminal U of the up-down counter 33 through the AND gate 115, one of whose input terminals is supplied with a high level signal when the subject temperature-measuring apparatus is in operation. The output signal of the count 5 is also delivered as a gate control signal to an AND gate 36 through an OR gate 35. An output signal from the AND gate 115 is conducted to the down-count terminal of the presettable up-down counter 28 and is also supplied as a gate signal to an AND gate 37. As the result, a clock pule issued from the oscillator 19 is sent forth to the up-down counter 33 through the AND gate 36 to cause the contents of the up-down counter 33 to be counted up, and is also delivered to the presettable up-down counter 28 through the AND gate 37 to cause the contents of the up-down counter 28 to be counted down. When detecting a zero count of the up-down counter 28, a zero-count detector 38 sends forth an output signal to the step counter 109 through the AND gate 106 which is now opened by an output signal of the count "5" from the step counter 109 and OR gate 108, causing the contents of the step counter 109 to advance to a count "6." An output signal of the count "6" from the step counter 109 is carried to the down-count terminal D of the counter 22 through the AND gate 116 which is now opened by an output signal from the zero count detector 38 and is also supplied as a gate control signal to an AND gate 39. An output signal from the AND gate 116 is delivered to the down-count terminal D of the up-down counter 33 and is also supplied as a gate control signal to the AND gate 36 through the OR gate 35. Accordingly, a clock pulse issued from the oscillator 19 is sent forth to the counter 22 through the AND gate 39 and OR gate 21 to cause the contents of the counter 22 to be counted down, and is also supplied to the counter 33 through the AND gate 36 to cause the contents of the counter 33 to be counted down. When detecting a zero count of the counter 22, a zero-count detector 40 sends forth an output signal to the step counter 109 through the AND gate 107 which is now opened by an output signal of the count "6" from the step counter 109 and OR gate 108, causing the contents of the step counter 109 to be advanced to a count "7". An output signal of the count "7" from the step counter 109 energizes a display unit 41 through the AND gate 117 which is now opened by an outut signal from the zero count detector 38, thereby displaying a digital data from the counter 33 which has been decoded by a decoder 42.

Now, Cx is taken to represent a count denoting a temperature data corresponding to the resistance of the resistor Rx held in the counter 28 which has been set by an output signal from the and gate 112. Cs is taken to represent a count denoting a temperature data corresponding to the resistance of the resistor Rs held in the counter 22 when the And gate 20 is closed or disabled by an output signal from the AND gate 113. Co is taken to show a count indicating a reference temperature data held in the counter 33 which is set by an output signal from the AND gate 114. The contents of the counter 33 are counted up in response to an output signal from the AND gate 115, until the contents of the counter 28 are counted down to zero. Namely, the contents of the counter 33 presents a count denoted by Co + Cx. The contents of the counter 33 are counted down in response to an output signal from the AND gate 116, until the contents of the counter 22 are counted down to zero. In this case, the contents of the counter 33 indicate a count represented by Co × Cx − Cs.

There will now be described why the count (Co + Cx − Cs) is regarded as correctly expressing the temperature of an object body on which the thermo-sensitive resistor Rx is placed.

First, reference is made to the case where the initial temperature $T_I$ is changed. In this case an equal amount of error ΔC occurs in the counts Cx and Cs. That is, a count Cl held in the counter 33 after processing operation is expressed as follows:

$$, C1 = Co + (cx1 + \Delta C1) - (Cs1 + \Delta C1) = Co + Cx1 - Cs1 \qquad (1)$$

Thus, the result is not affected by the change in initial temperature $T_I$. Where the reference voltage $V_R$ has been changed, the inclination of a straight line indicating the relationship of the temperature T and output voltage Eg is affected, as previously described. Supposed that change of the referential voltage $V_R$ by $\Delta V_R$ causes counts (Cs2 + ΔCs2) and (Cx2 + ΔCx2) to be held in the counter 23 and 37 respectively. The counts Cs2 and Cx2 are taken to denote those which would be held in said counters 22 and 37, if variation does not occur in the referential voltage $V_R$. That is, the counts (Cs2 + ΔCs2) and (Cx2 + ΔCx2) respectively correspond to the measured resistances of the resistors Rs and Rx and on the other hand, the counts Cs2 and Cx2 corresponds to the resistance of the resistors Rs and Rx1 respectively, at the temperature. The counts ΔCs2 and ΔCs2 show differences of temperature arising from the change $\Delta V_R$ of the referential voltage $V_r$.

After processing operation, a count C2 held in the counter 33 may be expressed as follows:
TI C1 = Co + (Cx2 + ΔCx2) − (Cs2 + ΔCs2)  (2)

where $$\Delta Cs2 = \frac{Cs2}{Cx2} \cdot \Delta Cx2 \qquad (3)$$

When the equation (3) is substituted in the equation (2), then there results:

$$C2 = Co + (Cx2 + \Delta Cx2) - (Cs2 + \frac{Cs2}{Cx2} \cdot \Delta Cx2) \qquad (4)$$

-continued
$$= Co + Cx2 - Cs2 + \Delta Cx2 (1 - \frac{Cs2}{Cx2})$$

At the referential temperature $T_O$ of, for example, 37° C, the standard resistor $R_s$ and thermo-sensitive resistor $R_x$ have substantially the same resistance. At a point near the referential temperature, for example, 33° C to 41° C, a count of $$\Delta Cx2(1 - \frac{Cs2}{Cx2})$$

is negligibly small, and the count $Co$ is set to be equal to the count $Cs2$. Therefore, the above equation (4) may be rewritten as follows:

$$c2 = Co + Cx2 - Cs2 = Cx2 \quad (5)$$

Namely, C2 may be regarded to denote a count unaffected by change in the referential voltage $V_R$.

Where change occurs in not only the reference voltage $V_R$ but the resistances of the resistors R1, R2 and R3, variation in the resistances of the resistors R1, R2 and R3 cause the counts Cx and Cs corresponding to the initial temperature to present the same amount of count differences $\Delta C$. Change in the reference voltage $V_R$ causes the inclination of the straight line indicating the relationship of T and Eg to be changed, that is, it causes the counts Cx and Cs to include count differences $\Delta Cx$ and $\Delta Cs$, respectively. Therefore, a count C3 held in the counter 33 after processing operation may be expressed as follows:

$$C3 = Co + (Cx3 + \Delta Cx3 + \Delta C3) - (Cs3 + \Delta Cs + \Delta C3) = Co + (Cx3 + \Delta Cx3) - (Cs3 + \Delta Cs3) \quad (6)$$

The above equation (6) may be calculated as follows by the same process as used with the equation (1):

$$C3 = Co + Cx3 - Cs3 + \Delta Cx3 (1 - \frac{Cs3}{Cx3}) \quad (7)$$

Since the term $$\Delta Cx3 (1 - \frac{Cs3}{Cx3})$$

has a negligibly small amount in the right side of the equation (6), there results:

$$C3 = Co + Cx3 - Cs3 \quad (8)$$

Figure 4:
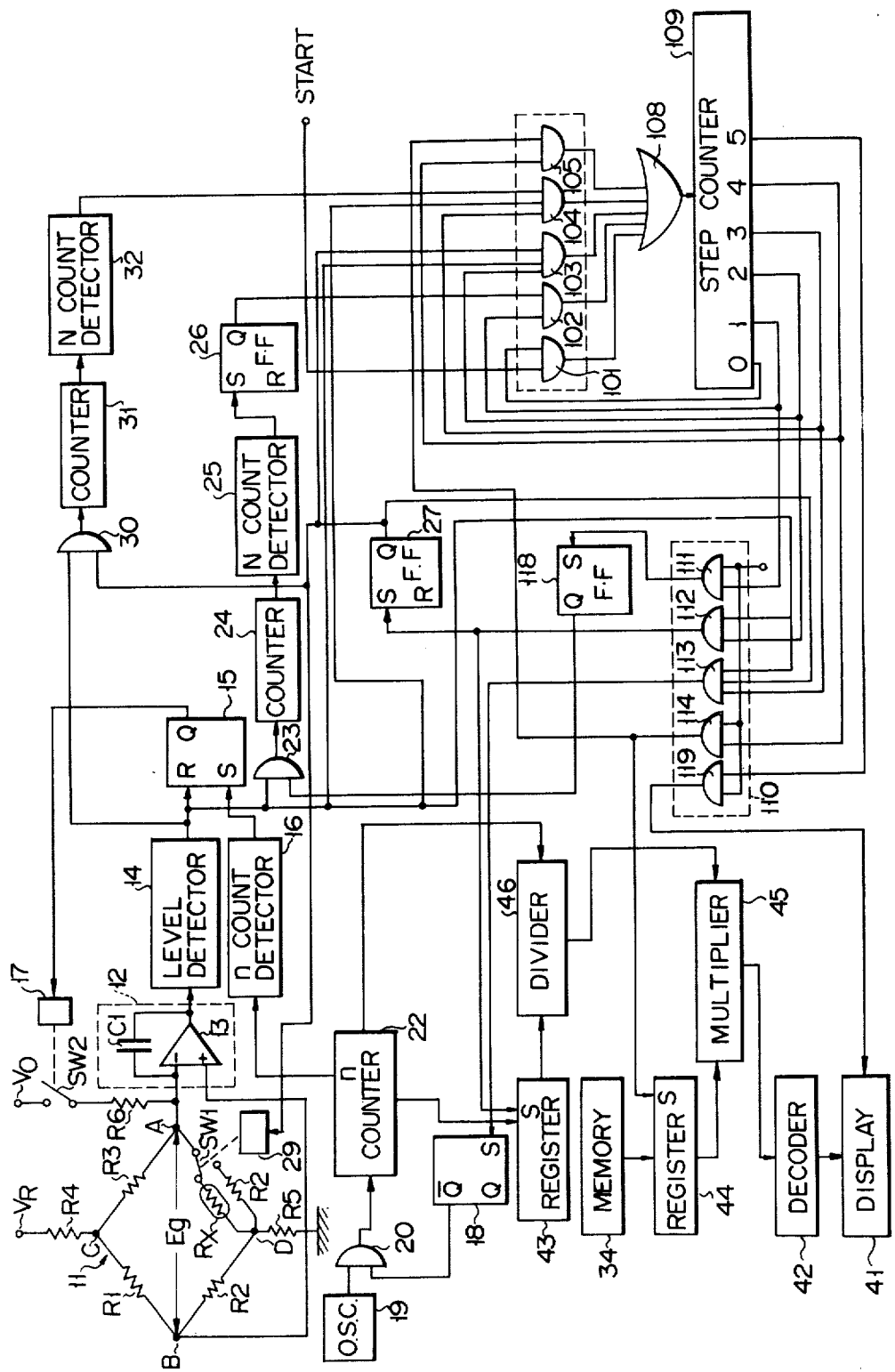
FIG. 4 is a circuit diagram of a body temperature-measuring apparatus according to another embodiment of the invention.

FIG. 4 is a block circuit diagram of a temperature-measuring apparatus according to another embodiment of this invention. The parts of FIG. 4 the same as those of FIG. 3 are denoted by the same numerals, description thereof being omitted.

A register 43 is set by an output signal from the AND gate 112 to hold a count Cx corresponding to the resistance of the resistor Rx. When the AND gate 20 is closed by an output signal from the AND gate 113, then the counter 22 holds a count Cs corresponding to the resistance of the resistor Rx. Output signals from the register 43 and counter 22 are supplied to a divider 46, which in turn generates a signal of Cx/Cs.

a register 44 is set by an output signal from the AND gate 114 to hold a count Co corresponding to a referential temperature data stored in the memory 34. An output signal from the register 44 is conducted to a multiplier 45 supplied with an output signal from the divider 46. The multiplier 45 multiplies an output signal from the divider 46 by that from the register 44, to produce an output signal of $Co\cdot Cx/Cs$. An output signal from the multiplier 45 is delivered through a decoder 42 to a display unit 41 which is energized by an output signal of the count "5" from the step counter 109 through the AND gate 119.

The second embodiment of FIG. 4 enables a temperature to be measured with high precision without eing affected by change in the referential voltage and the resistance of the resistors R1, R2 and R3.

Where the referential voltage $V_R$ changes by $\Delta V_R$, then the register 43 holds a count of $Cx4 + \Delta Cx4$, and the counter 22 holds a count of $Cs4 + \Delta Cs4$. Therefore, an output signal C4 from the multiplier 45 may be expressed as follows $$C4 = Co \cdot \frac{(Cx4 + \Delta Cx4)}{(Cs4 + \Delta Cs4)} \quad (9)$$

where the term $\Delta Cs4$ is expressed by $$\frac{Cx4}{Cs4} \cdot \Delta Cs4 \quad (10)$$

where, therefore, the above equation (10) is substituted in the equation (9) there results:

$$C4 = Co \cdot \frac{Cx4 (1 + \frac{\Delta Cs4}{Cs4})}{Cs4 + \Delta Cs4} = \frac{Co \cdot Cx4}{Cs4} \quad (11)$$

Namely, the output count signal C4 from the multiplier 45 shows a count unaffected by change in the referential voltage $V_R$.

When variation takes place in not only the referential voltage $V_r$, but also the resistances of the resistors R1, R2 and R3, then change in the resistances of the resistors R1, R2 and R3 causes the counts Cx and Cs to present the same count differences $\Delta C$. Variation in the reference voltage $V_R$ causes the counts Cx and Cs to indicate count differences $\Delta Cx$ and $\Delta Cs$ respectively. Therefore, an output signal C5 from the multiplier 45 may be expressed as follows $$C5 = \frac{Co \cdot Cx}{Cs} = Co \cdot \frac{(Cx5 + \Delta Cx5 + \Delta C5)}{(Cs5 + \Delta Cs5 + \Delta C5)} \quad (12)$$

$$= Co \cdot \frac{(Cx5 + \Delta Cx5 + \Delta C5)}{(Cs5 + Cs5 \cdot \frac{\Delta Cx5}{Cx5} + \Delta C5)}$$

$$= Co \cdot \frac{Cx5(1 + \frac{\Delta Cx5}{Cx5}) + \Delta C5}{Cs5(1 + \frac{\Delta Cx5}{Cx5}) + \Delta C5}$$

$$= Co \cdot \frac{\frac{Cx5}{Cs5} + \frac{\Delta C5}{Cs5(1 + \frac{\Delta Cx5}{Cx5})}}{1 + \frac{\Delta C5}{Cs5(1 + \frac{\Delta Cx5}{Cx5})}}$$

$$= Co \cdot \left\{ \frac{Cx5}{Cs5} + \frac{\frac{\Delta C5}{Cs5(1 + \frac{\Delta Cx5}{Cx5})} \cdot (1 - \frac{Cx5}{Cs5})}{1 + \frac{\Delta C5}{Cs5(1 + \frac{\Delta Cx5}{Cx5})}} \right\}$$

Since ΔC5 is fully smaller than Cs5, the equation (11) above may be rewritten as follows:

$$C4 = \frac{Co \cdot Cx5}{Cs5} + \frac{Co \cdot \Delta C5}{Cs5(1 + \frac{\Delta Cs5}{Cs5})}(1 - \frac{Cx5}{Cs5}) \quad (13)$$

The second term on the right side of the above equation (13) shows errors E. Since, at the referential temperature, the resistors Rx and Rs have an equal resistance, the counts Cx5 and Cs5 have substantially the same value at a point near the referential temperature. Where a body temperature indicates 40° C with the referential temperature taken to be 37° C, the above-equation (13) may be expressed as follows:

$$C5 = 40 - \frac{Co \cdot \Delta C5}{Cs5(1 + \frac{\Delta Cs5}{Cs5})} \times 0.08 \quad (14)$$

Since the right second term of the above equation (14) is negligibly small, a body temperature can be measured with high precision without being affected by change in the resistances of the resistors R1, R2 and R3.

This invention has been described by reference to the fforegoing embodiments. However, the invention is not limited to these embodiments. Namely, a body temperature can be measured as accurately as in the embodiment of FIG. 3, by substituting the divider 46 and multiplier 45 of FIG. 4 by a subtractor and adder. In this case, the subject temperature-measuring apparatus can be so constructed as to connect the counter 22, registers 43 and 44 to a desk top electronic calculator, thereby carrying out multiplication, division, addition and subtraction by the calculator. Further, the bridge circuit used with the foregoing embodiments may be replaced by a voltage divider of FIGS. 5 and 6.

Passive circuit elements such as capacitors and inductors or the combination thereof can be substituted for the resistors R1, R2 and R3 and in this case an a.c. power source may be used to provide a reference voltage $V_R$. Further, as shown in FIGS. 7 and 8, a diode Dx connected in a forward direction with respect to the reference voltage $V_R$ can be substituted for the thermo-sensitive resistor Rx.

This invention is applicable to measurement of not only a body temperature, but also temperature falling within a prescribed range.

What we claim is:

1. A temperature measuring apparatus comprising:
   dual slope type analog signal generating means which includes first and second power supply terminals, a standard resistor whose resistance is little affected by temperature change, a series circuit connected between said first and second power supply terminal and including a passive circuit element connected at one terminal to said first power supply terminal, a thermo-sensitive resistor whose resistance varies with temperature and becomes equal at a reference temperature to the resistance of said standard resistor and first switching means taking first and second operative positions to respectively connect said thermo-sensitive resistor and standard resistor to said passive circuit element between said first and second power supply terminals, a third power supply terminal, a series circuit of resistive means and second switching means connected between the other terminal of said passive circuit element and said third power supply terminal, and an integrating circuit whose input terminal is connected to the other terminal of said passive circuit element;
   digital data generating means responsive to an output signal from said integrating circuit for producing digital data corresponding to the measured resistances of said thermo-sensitive resistor and standard resistor according to the operative positions of said first switching means and thereafter for producing a switch control signal;
   switch setting means for selectively setting said first switching means to the first or second operative position and setting said second switching means to connect said third power supply terminal to the other terminal of said passive circuit element through said second switching means and said resistive means a predetermined time after said integrating circuit has started an integrating operation; and
   a processing circuit for processing the digital data which are supplied from said digital data generating means and correspond to the measured resistances of the thermo-sensitive resistor and standard resistor and producing temperature data corresponding to the resistance of the thermo-sensitive resistor.

2. The temperature measuring apparatus according to claim 5 which further comprises fourth and fifth power supply terminals and a series circuit of third and fourth resistive means connected between said fourth and fifth power supply terminals, and wherein said digital data generating means is supplied with a potential difference between the other terminal of said first resistive means and a junction of said third and fourth resistive means.

3. The temperature-measuring apparatus according to claim 2, said thermo-sensitive resistor is formed of a thermistor.

4. The temperature-measuring apparatus according to claim 2, said thermo-sensitive resistor is formed of a diode connected in a forward direction.

5. A temperature measuring apparatus comprising:
   dual slope type analog signal generating means which includes first and second power supply terminals, a standard resistor whose resistance is little affected by temperature change, a series circuit connected between said first and second power supply terminals and including first resistive means connected at one terminal to said first power supply terminal, a thermo-sensitive resistor whose resistance varies with temperature and becomes substantially equal at a reference temperature to the resistance of said standard resistor and first switching means taking first and second operative positions to respectively connect said thermo-sensitive resistor and standard resistor to said first resistive means between said first and second power supply terminals, a third power supply terminal, a series circuit of a second resistive means and second switching means connected between the other terminal of said first resistive means and said third power supply terminal, and an integrating circuit whose input terminal is connected to the other terminal of said first resistive means;
   digital data generating means responsive to an output signal from said integrating circuit for producing digital data corresponding to the measured resistances of thermo-sensitive resistor and standard resistor according to the operative position of said first switching means and thereafter for producing a switch control signal;

switch setting means for selectively setting said first switching means to the first or second operative position and setting said second switching means to connect said third power supply terminal to the other terminal of said first resistive means through said second switching means and a second resistive means a predetermined time after said integrating circuit has started an integrating operation; and a processing circuit for processing the digital data which are supplied from said digital data generating means and correspond to the measured resistances of the thermo-sensitive resistor and standard resistor and producing temperature data corresponding to the resistance of the thermo-sensitive resistor.

6. The temperature-measuring apparatus according to claim 5, wherein the processing circuit comprises a subtractor for subtracting digital data corresponding to the measured resistance of the standard resistor from digital data corresponding to the measured resistance of the thermo-sensitive resistor;

first storing means for storing digital data corresponding to the reference temperature; and an adder for adding a digital data supplied from the subtractor to a digital data read out from the second means.

7. the temperature-measuring apparatus according to claim 6, wherein the adder and subtractor are those of a desk top electronic calculator.

8. The temperature-measuring apparatus according to claim 5, wherein the processing circuit comprises a divider for dividing digital data corresponding to the measured resistance of the thermo-sensitive resistor which has been supplied from the digital data generating means by digital data corresponding to the measured resistance of the standard resistor; storing means for storing digital data corresponding to the reference temperature; and a multiplier for multiplying digital data obtained from the divider by digital data supplied from the storing means.

9. The temperature-measuring apparatus according to claim 8, wherein the multiplier and divider are those used with a desk top electronic calculator.

10. The temperature-measuring apparatus according to claim 9, said thermo-sensitive resistor is formed of a diode connected in a forward direction.

11. The temperature-measuring apparatus according to claim 8, said thermo-sensitive resistor is formed of a thermistor.

12. The temperature measuring apparatus according to claim 5, which further comprises a series circuit of third and fourth resistive means connected between said first and second power supply terminals and wherein said integrating circuit is supplied with a potential difference between the other terminal of sid first resistive means and a junction of said third and fourth resistive means.

13. The temperature-measuring apparatus according to claim 12, said thermo-sensitive resistor is formed of a thermistor.

14. The temperature-measuring apparatus according to claim 12, said thermo-sensitive resistor is formed of a diode connected in a forward direction.

15. The temperature-measuring apparatus according to claim 14, wherein the adder and subtractor are those of a desk top electronic calculator.

16. The temperature-measuring apparatus according to claim 5, in which said processing circuit includes first and second storing circuits and which further includes a control means for setting into the first storing circuit the digital data which corresponds to the measured resistance of the thermo-sensitive resistor and is supplied from the digital data generating means when the first switching means takes the first operative position, setting into the second storing circuit the digital data which corresponds to the measured resistance of the standard resistor and is supplied from the digital data generating means when the first switching means takes the second operative position, and controlling the processing circuit to process the digital data stored in the first and second storing circuit.

* * * * *